US005102523A

United States Patent [19]

Beisswenger et al.

[11] Patent Number: 5,102,523

[45] Date of Patent: Apr. 7, 1992

[54] ARRANGEMENT FOR THE PRODUCTION OF A PLASMA

[75] Inventors: Siegfried Beisswenger, Alzenau; Barbara Beichler, Rodgau; Michael Geisler, Wächtersbach; Stefan Reineck, Langgöns, all of Fed. Rep. of Germany

[73] Assignee: Leybold Aktiengesellschaft, Hanau I, Fed. Rep. of Germany

[21] Appl. No.: 603,795

[22] Filed: Oct. 25, 1990

[30] Foreign Application Priority Data

Aug. 10, 1990 [DE] Fed. Rep. of Germany ....... 4025396

[51] Int. Cl.[5] .......................... H01H 1/46; C23F 4/04

[52] U.S. Cl. .......................... 204/298.33; 204/298.31; 204/298.34; 118/723; 156/345

[58] Field of Search ...................... 204/298.31, 298.33, 204/298.34; 156/345; 118/723

[56] References Cited

U.S. PATENT DOCUMENTS

| | | | |
|---|---|---|---|
| 3,730,873 | 5/1973 | Pompei et al. | 204/298.34 |
| 4,230,515 | 10/1980 | Zajac | 156/345 |
| 4,340,462 | 7/1982 | Koch | 204/298.35 |
| 4,342,901 | 8/1982 | Zajac | 219/121.4 |
| 4,500,563 | 2/1985 | Ellenberger et al. | 427/38 |
| 4,585,516 | 4/1986 | Corn et al. | 156/643 |
| 4,961,812 | 10/1990 | Baerg et al. | 156/345 |

FOREIGN PATENT DOCUMENTS

| | | | |
|---|---|---|---|
| 0019370B1 | 9/1983 | European Pat. Off. | 204/298.33 |
| 0139835 | 5/1985 | European Pat. Off. | 156/643 |
| 0066088B1 | 11/1986 | European Pat. Off. | 204/298.31 |
| 0327253A2 | 8/1989 | European Pat. Off. | 118/723 |
| 3204311 | 9/1982 | Fed. Rep. of Germany | 204/298.31 |
| 2241229C2 | 1/1983 | Fed. Rep. of Germany | 204/298.31 |
| 3606959A1 | 9/1987 | Fed. Rep. of Germany | 204/298.33 |
| 3708717 | 9/1988 | Fed. Rep. of Germany | |

OTHER PUBLICATIONS

B. N. Chapman, *IBM Tech. Disc. Bull.*, vol. 22, No. 12, pp. 5316-5317 (May 1980).

J. L. Vossen, J. Electrochem. Soc., vol. 126, No. 2, Feb. 1979, pp. 319-324.

R. A. Morgan, "Plasma Etching in Semiconductor Fabrication", *Plasma Technology*, 1, Elsevier (1985), pp. 37-40.

S. J. Fonash: Advances in Dry Etching Processes-A Review, *Solid State Technology*, 1985, pp. 150-158, Figure 2.

Rainer Postl: Plasmaätzen in Drei-Elektroden-Zwei--Frequenzen-Reaktor, *Productronic* 11, 1987, pp. 95-98.

J. Waldorf, H. Oechsner, H. -J. Füsser: Generation of surface layers and microstructures with a low energy plasma beam source, *Thin Solid Films*, 174, 1989, pp. 39-44.

Brian Chapman: "Glow Discharge Processes", 1980, Wiley & Sons, pp. 139-163.

*Primary Examiner*—Aaron Weisstuch

*Attorney, Agent, or Firm*—Felfe & Lynch

[57] ABSTRACT

The invention relates to an arrangement for the production of a plasma as well as for applying charged and uncharged particles onto a substrate. Two areal electrodes connected to a voltage source are provided between which a plasma volume excited by high-frequency energy is ignited. The areal ratio of the two electrodes is variable in order to influence the energy of the ions impinging on a substrate. Furthermore, supplying of process gas distributed over the entire substrate area is possible.

12 Claims, 4 Drawing Sheets

ARRANGEMENT FOR THE PRODUCTION OF A PLASMA

The invention relates to an arrangement for the production of a plasma.

In the production of microelectronic structural elements onto highly pure substrates, for example, extremely pure aluminum oxide ($Al_2O_3$) or highly pure silicon monocrystal wafers are applied with insulating, semiconducting, or conducting layers. As suitable coating methods there are known: vapor deposition, molecular beam epitaxy, sputtering, and chemical vapor deposition or CVD. These coating methods can be modified by ion bombardment or by exposure to gas discharge. The latter methods are known as ion or plasma enhanced coating processes.

The gas discharge can be carried out by means of a diode discharge wherein the substrate to be coated is disposed between two electrodes which, in turn, are connected to a dc or ac voltage. A carrier gas introduced into the space between the electrodes is ionized by the electromagnetic field between the electrodes so that charged particles can be deposited out of the plasma onto the substrate.

It is also known to provide three electrodes instead of two electrodes. This method is referred to as the triode etching process. It is characteristic of the known diode and triode processes that the individual electrodes are essentially of equal size (S.J. Fonash: "Advances in Dry Etching Processes—A Review," *Solid State Technology*, 1985, pages 150–158, FIG. 2; U.S. Pat. No. 4,500,563). Triodes are furthermore known in which at least one electrode is implemented differently than the two other electrodes (EP 0 139 835; U.S. Pat. No. 4,585,516). These triodes operate as a rule with two different voltages differing from each other in frequency (Rainer Postl: "Plasmaätzen in Drei-Elektroden-Zwei-Frequenzen-Reaktor," *Productronic* 11, 1987, pages 95 to 98).

As a rule the three electrode processes are, however, minimally suitable for the large area application of a $SiO_x$ structure onto a substrate. These structures are electrically non-conducting and cannot carry off the electrical charges of the impinging particles. This leads to a charging up of the substrate bombarded with charged particles. Through the therein generated electrical opposing field the charged particles are decelerated and the desired surface bombardment comes to a standstill.

If the electrodes are impressed with high-frequency ac fields, the plasma, which is normally neutral toward the outside, assumes a positive potential relative to the bombarded electrode because the electrons have a higher mobility compared to the ions. Thus more electrons than ions arrive at the electrode during one half-wave of the applied ac voltage (J. Waldorf, H. Oechsner, H.-J. Fusser: "Generation of surface layers and microstructures with a low energy plasma beam source," *Thin Solid Films*, 174, 1989, pages 39 to 44). In order that the quasi-neutrality of the plasma be maintained the plasma as a whole assumes a positive potential which corresponds approximately to the amplitude of the high-frequency voltage.

In order to be able to deposit electrically poorly or non-conducting structures over large areas on a substrate an ion source is already known in which particles generated in a low-pressure plasma are accelerated by a high frequency voltage onto a grid electrode whose apertures are smaller than the thickness of the space charge layer between the electrode and the plasma (DE-PS 37 08 717). An opposing electrode is provided therein whose area assigned to the plasma is a multiple of the area of the extracting grid electrode. To this end it can be implemented in the form of a metal cup with an opening facing the plasma. A disadvantage is that the kinetic energy of the ions cannot be varied because this energy is a function, on the one hand, of the applied high-frequency power and, on the other hand, of the ratio of the electrode areas to each other and at least the area ratio of the electrodes is fixed.

The object of the invention is therefore to be able to set the kinetic energy of the ions impinging on a substrate independently of the discharge power.

This object is solved in accordance with the features of the present invention.

The advantage achieved with the invention comprises in particular that through the setting of the particle energy the quality of layers applied on a substrate is improved. While for the optimization of the deposition rate the power of the supplied ionization voltage is an important parameter, the particle energy is decisive for the quality of the layer. Depending on the substrate and the requirement profile of the desired coating before or also during the coating the area ratio of the electrodes can specifically be changed and therewith simultaneously the energy of the ions which reach the substrate can be varied. It is, for example, possible to start in the case of sensitive substrates with a gentle process and to either proceed stepwise or continuously to a stronger ion bombardment in order to allow a layer of maximum density and hardness to grow. A further advantage of the variable layer treatment comprises the ability of compensating the negative effects of markedly different coefficients of expansion between substrate and plasma enhanced chemical vapor deposition (PECVD) layer and the capacity of thicker layers up to approximately 5 μm to adhere without any problems.

Am embodiment of the invention is represented in the drawing and will be described in greater detail in the following.

Figure 1:
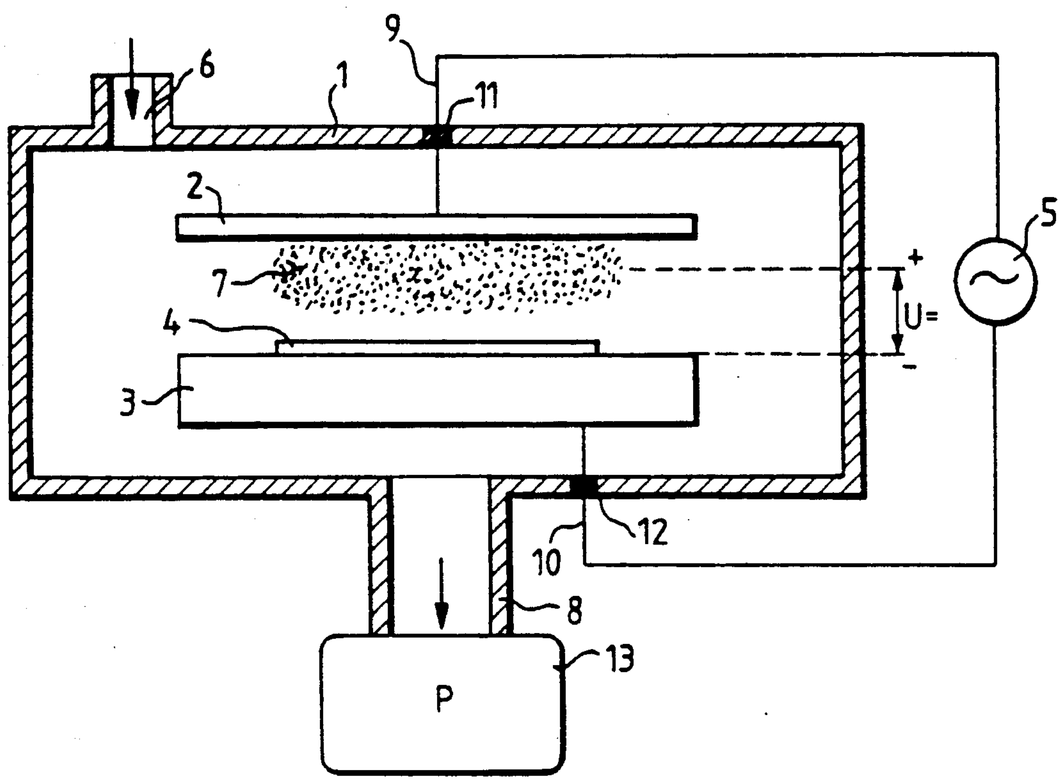
FIG. 1 is a prior art diode configuration in which a plasma is generated between two electrodes connected to a high-frequency generator.

In FIG. 1 is represented a prior art diode configuration for coating a substrate from a plasma. Herein are disposed in a vacuum chamber 1 two opposing electrodes 2, 3 of which the lower electrode 3 is a holder for a substrate 4 to be coated. Both electrodes 2, 3 are connected to a high-frequency voltage source 5 which operates, for example, with a frequency of 13.56 MHz. Through an inlet port 6 a gas is introduced into the vacuum chamber 1 and ionized between the electrodes 2, 3 with the aid of the high-frequency voltage so that a plasma 7 develops therebetween. Ions from this plasma 7 impinge the substrate 4 and are there deposited or serve for etching. Excess gas particles are drawn off through a vacuum port 8 by a pump 13 which also maintains the requisite vacuum in the chamber 1. The electrical feed lines 9, 10 of the voltage source 5 are connected to the electrodes 2, 3 through insulators 11, 12.

As already stated above, in time a dc voltage $U_=$ sets up between the plasma 7 and the electrode 3 which is generated due to the greater mobility of the electrons in comparison to the ions. The ac field between electrodes 2, 3 is consequently superimposed by a dc field. For generating the plasma 7 primarily the amplitude of the applied ac voltage 5 is responsible. The higher this amplitude the stronger the charged gas particles are accelerated and the greater the number of ions generated by the collision with neutral particles. The degree of ionization is determined by the amplitude of the applied ac voltage. The energy with which the charged particles impinge on the substrate 4 is a function of the velocity with which they impinge on the substrate. This velocity of the positively charged ions is determined primarily by the dc voltage U; and specifically according to the formula $$\frac{1}{2} mv^2 = e \times U_=,$$

wherein m is the mass of a charged particle, v its velocity, e its charge and U the dc voltage $U_=$ present between the plasma 7 and the electrode 3. The dc voltage $U_=$ determining the acceleration of the ions with appropriate choice of the area ratio of the electrode 2 to the electrode 3 corresponds to the amplitude of the high-frequency voltage source 5. The energy of the ions consequently can also be changed by varying the amplitude of the voltage source 5.

Figure 2:
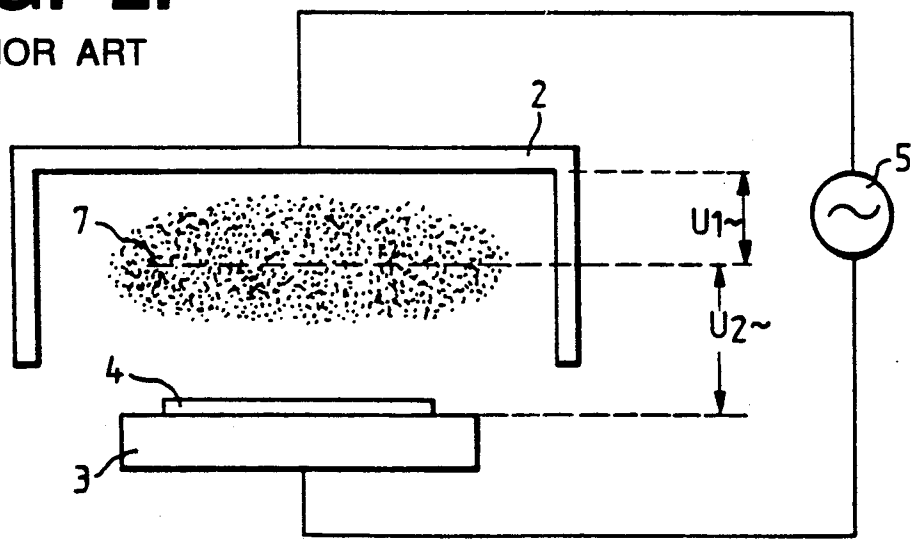
FIG. 2 is a simplified representation of a diode configuration in which one electrode is greater than the other.

In FIG. 2 the two electrodes 2 and 3 are shown again without the vacuum chamber 1 wherein, however, the electrode 2 has a significantly larger surface area than the electrode 3. If the voltage between the two electrodes 2, 3 or at the plasma resistance is divided into two partial voltages $U_1$ or $U_2$ then $$\frac{U_{2\sim}}{U_{1\sim}} = \left(\frac{\text{area of electrode 2}}{\text{area of electrode 3}}\right)^4$$

applies. This formula was derived by Maissel and König (Brian Chapman: "Glow Discharge Processes," 1980, Wiley & Sons).

Consequently, if the area of electrode 2 is greater than that of electrode 3 practically the entire high-frequency voltage occurs between the plasma 7 and the electrode 3 thus increasing dc voltage $U_=$ i.e. the dc voltage developing between the electrode 2 and the plasma 7 is negligibly small. Hereby a specific ion bombardment on electrode 3 is achieved which can either initiate an etching process (sputtering) or densify a growing layer if on this electrode a substrate is fastened and coating takes place from a gaseous phase (CVD). Moreover, it is avoided that the electrode 2 is coated or etched from the plasma 7.

Variation of the area is meaningful only if operation takes place with frequencies which are so high that the ions cannot reach the electrode within one half period. Only in this way can the different mobility of the ions and electrons be utilized and a potential corresponding to the area ratio build up at the electrodes.

Figure 3:
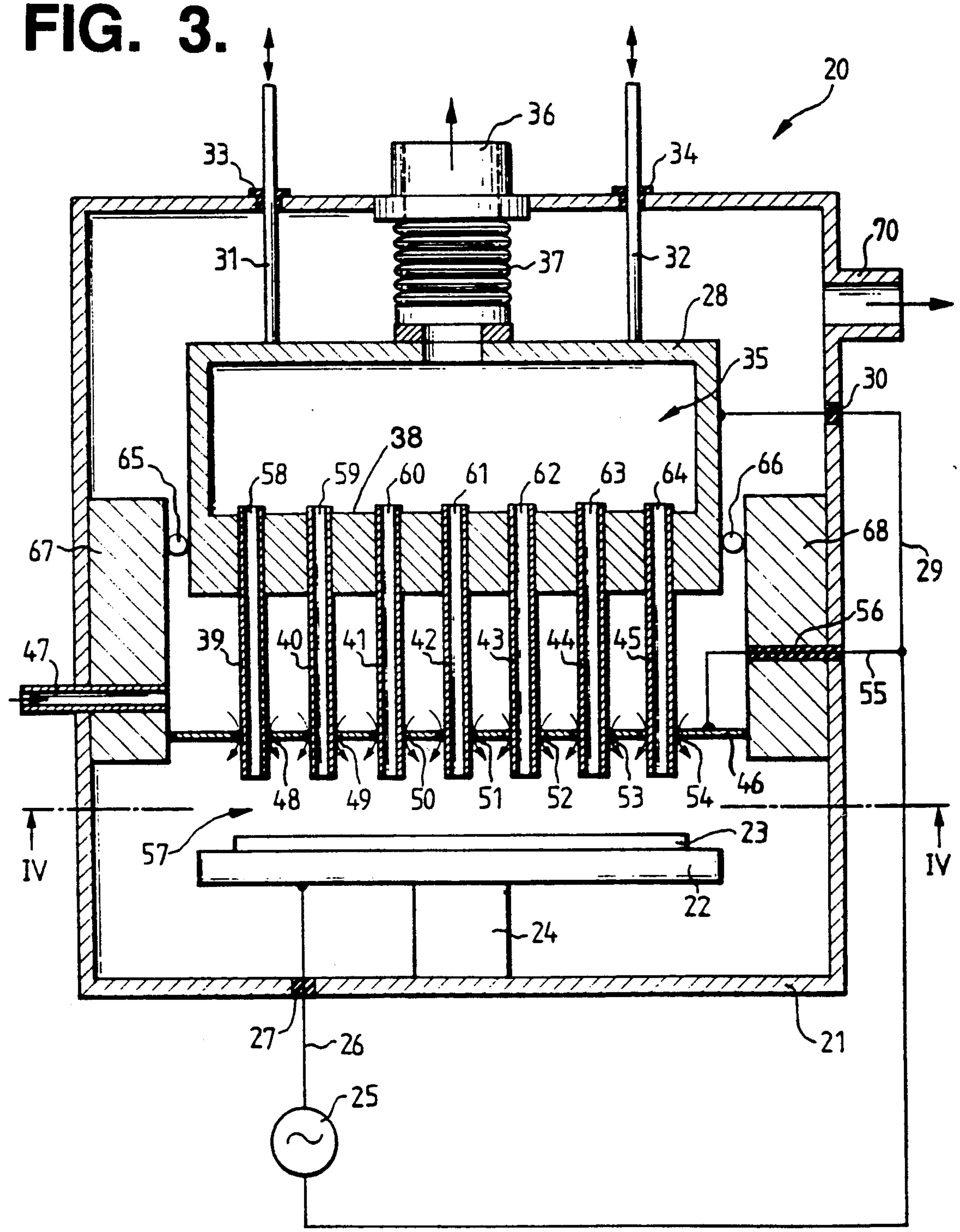
FIG. 3 is a lateral section of a device in accordance with the invention with one electrode of variable surface area opposing an electrode with fixed surface area.

In FIG. 3 there is shown a device 20 in accordance with the invention with which the electrode surface areas and consequently the dc voltage between the plasma and electrodes can be varied. This device 20 has in a housing 21 an electrode 22 carrying a substrate 23 and which via an insulator 24 is mounted in the housing 21. The electrode 22 is electrically connected with a high-frequency generator 25 wherein the electrical feed line 26 is guided through an insulator 27 in the housing 21. An opposing electrode 28 is connected to the second terminal of the high-frequency generator 25 whose feed line 29 likewise is guided through a insulator 30 in the housing 21. The opposing electrode 28 in cross section has the shape of a rectangular box which by means of two rods 31, 32 can be raised and lowered and which project through seals 33, 34 from the top of the housing 21. The hollow space 35 of the opposing electrode 28 is connected to a vacuum port 36 via bellows 37. By means of a pump (not shown) the vacuum in the hollow space 35 is maintained via the vacuum port 36 and the bellows 37. Into the bottom 38 of the opposing electrode 28 are set several feed pipes 39 to 45 which project with one end into the hollow space 35 and with their other ends oppose the substrate 23.

At a distance from the opposing electrode 28 is disposed a stationary metal plate 46 through which pipes 39 to 45 are guided. Above this metal plate 46 is disposed a gas inlet port 47 through which reactive gas is introduced from the outside into the space between metal plate 46 and bottom 38 of the opposing electrode 28. This gas can penetrate through openings 48 to 54 between the external walls of the feed pipes 39 to 45 into the space between metal plate 46 and substrate 23 or electrode 22, respectively. The metal plate 46, via an electric feed line 55 carried through an insulator 56 into the interior space of the housing 21, is at the same potential as the opposing electrode 28. Consequently, the electrode opposing electrode 22 actually comprises the opposing electrode 28, the pipes 39 to 45 electrically connected with it, and the metal plate 46.

Plasma comparable to the plasma 7 shown in FIG. 1 is generated in the space 57 between electrode 22 and metal plate 46. The acceleration voltage for the ions in a manner according to the invention can be varied by raising or lowering the opposing electrode 28 via the rods 31, 32. Hereby the pipes 39 to 45 are also raised or lowered, which causes a change of the electrode surface area because this surface area is formed by the metal plate 46 and the external surfaces of the pipes 39 to 45 projecting from the metal plate 46 downward. A lowering of the opposing electrodes 28 effects consequently an enlargement of the electrode surface while raising this opposing electrode 28 effects a decrease of the electrode surface. Through the hollow spaces 58 to 64 of the pipes 39 to 45 the vacuum in the process space which is located between metal plate 46 and electrode 22 is maintained. So that the gas streaming in via the inlet port 47 cannot escape upward in spite of the vertical motion of the opposing electrode 28 seals 65, 66 are provided between the opposing electrode 28 and lateral supports which, in turn, are connected with the housing 21.

The substrate 23 can have a relatively large surface area. Limiting the area could be required if the substrate length reaches the order of magnitude of the wave length corresponding to the frequency of power supply 25 which at 13.56 MHz is approximately 22.11 m. Therefore large electrodes, i.e. electrodes starting at a length of 2 to 3 m, are subdivided and fed with separate high-frequency sources. The vacuum port 70 is normally not required; it is only necessary to ensure that the seals 66 are implemented so that no leakage occurs with movement of the electrode body 28. The vacuum port 70 consequently is a safety measure in order to still be able to evacuate in the presence of potential leakages.

Figure 4:
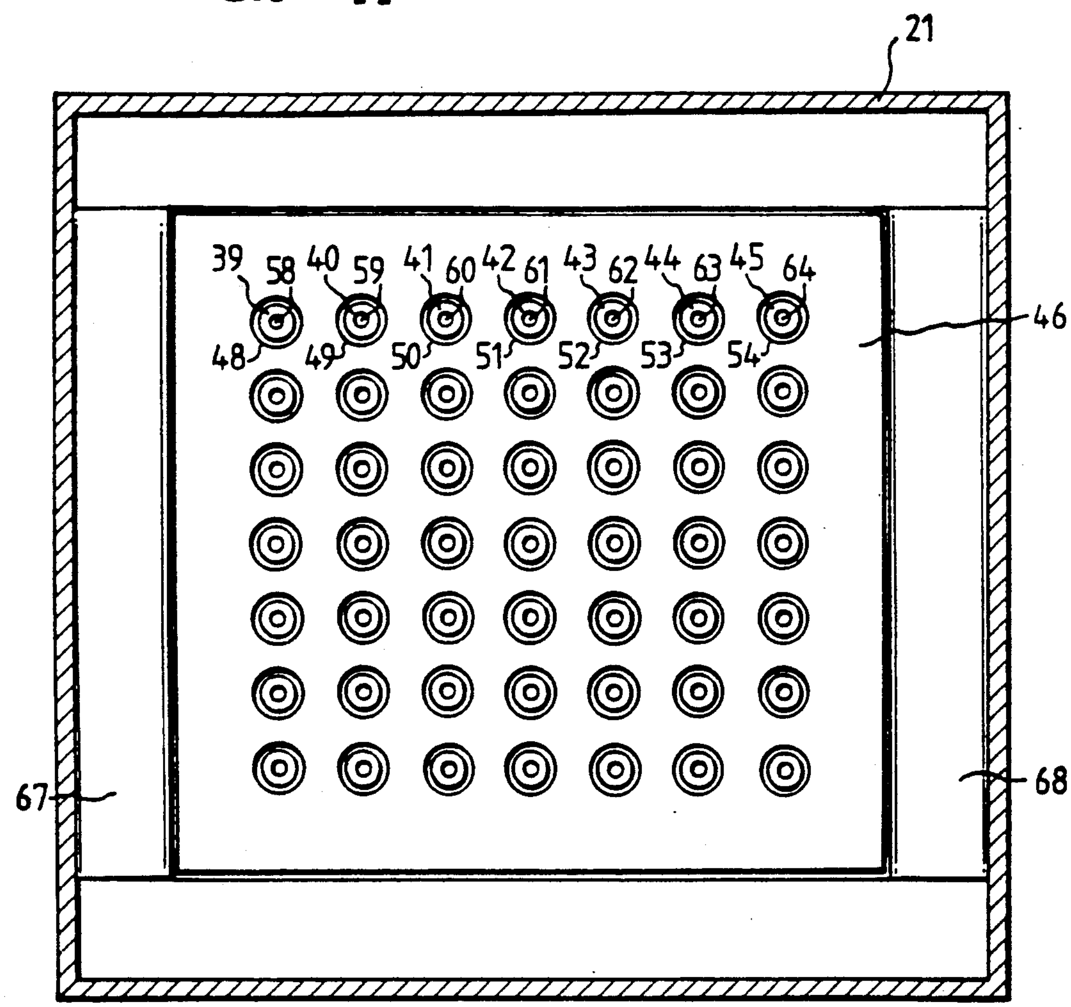
FIG. 4 is a view from below onto an electrode plate with several through-bores.

In FIG. 4 is shown a section IV—IV through the housing 21 of FIG. 3. Herein, pipes 39 to 45 can be seen with their through-bores 58 to 64 and the passages 48 to 54 for the reactive gas surrounding the pipes 39 to 45. While in the device according to FIG. 3, the opposing electrode 28 with the pipes 39 to 45 is vertically movable and the metal plate 46 is rigid, in a variation of the invention the relationships can, of course, be reversed without the effect of the invention thereby being lost. To this end, for example, the bottom of the housing electrically insulating elements are provided, which with telescoping tappets projecting upward, are connected with the metal plate 46. With a stationary opposing electrode the metal plate 46 can in this case be moved upward or downward.

Through the arrangement according to the invention it is not only possible to vary the ratio of the area of the electrode 22 to the area of the effective opposing electrode and therewith the voltage division in the plasma space, but also a more uniform distribution of the reactive gas can be achieved. In particular, with large-area substrates, for example, motor vehicle windows which are to be coated, more uniform coatings are achieved through the reactive gases distributed over the entire area of the electrodes.

As is evident from FIG. 1, the gas streaming in through the single inlet port 6 cannot be distributed uniformly between the electrodes 2 and 3. In contrast, the reactive gas which in the embodiment example of FIG. 3 is let in through the inlet port 47 is initially introduced into the space between metal plate 46 and opposing electrode 28 and then, due to excess pressure, is led through the openings 48 to 54 uniformly into the space between substrate 23 and metal plate 46.

The great significance of the invention lies in the large-area static coating. In such a coating high uniformity of layer thickness and characteristics must be ensured. Through the special configuration of gas inlet and draw-off openings this goal is achieved. Compared to known arrangements in which the gas inlet takes place via a perforated electrode and the gas is pumped off at the edges of the electrode, the invention has the advantage that an impoverishment or enrichment of the process gas on the way to the electrode edges is avoided nd edge effects are compensated. The upper electrode is in effect divided into individual matrix elements which each contain a closed gas guiding system with a draw-off port and associated gas inlets and in this way ensure a uniform gas supply and a controlled dwelling time of the process gas in a defined plasma volume. Consequently, the occurrence of locally different concentrations of different process gas fragments which are of decisive significance for the characteristics of the layer to be built up, is prevented. This is important in the performance of large-area electronic layer processes, for example in the production of solar cells from amorphous silicon, or of thin film displays. Consequently, with the invention not only a uniform layer thickness but also an extraordinarily good layer quality over large areas is achieved, and this through the addition of further matrix elements, offers problem-free scalability.

Figure 5:
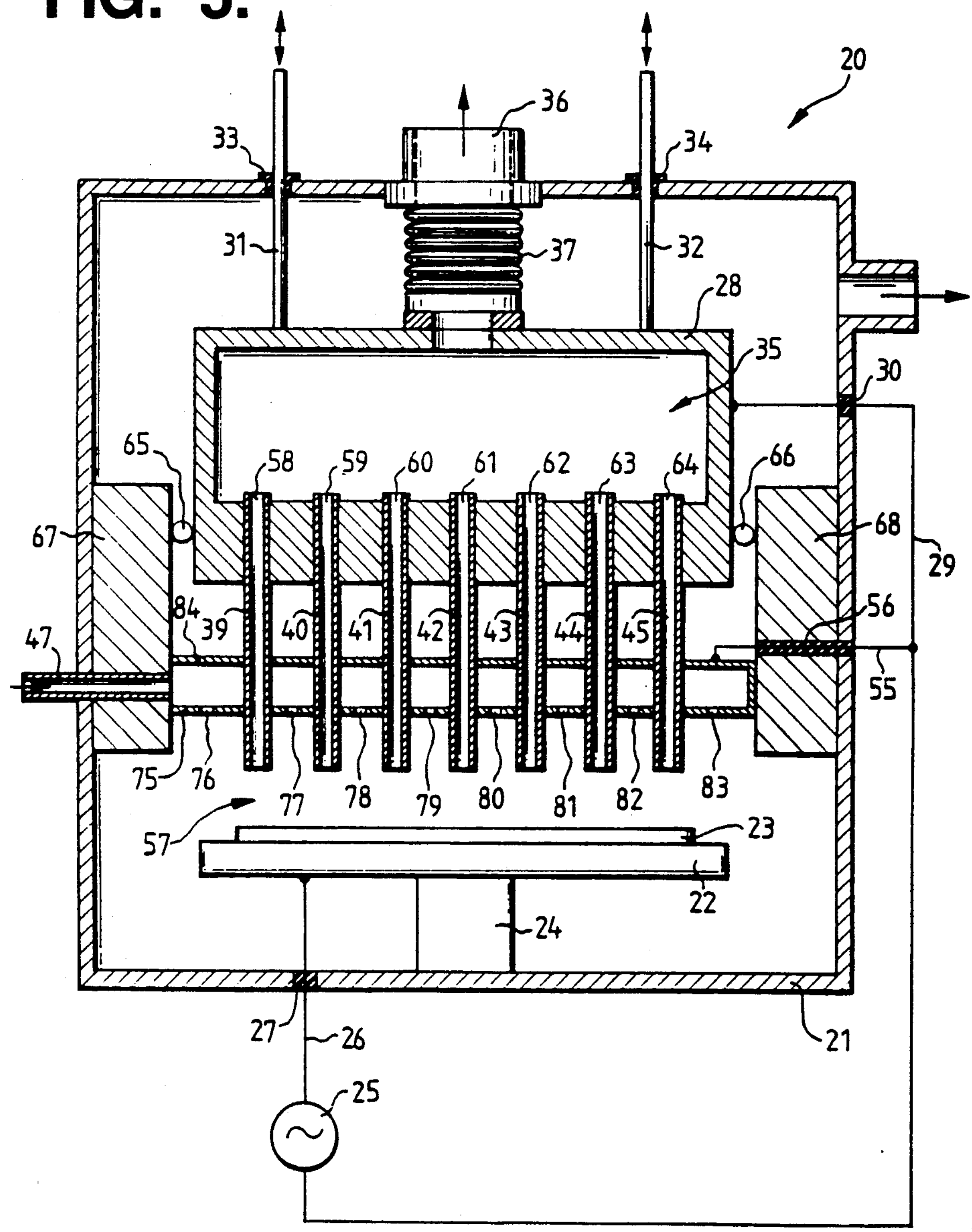
FIG. 5 is a lateral section of an arrangement according to FIG. 3 in which a gas feed plate is implemented as a hollow space.

Instead of a thin and solid metal plate 46 as shown in FIG. 3, a hollow metal plate can also be used as shown in FIG. 5. The lower wall 75 of this hollow metal plate is provided with openings 76 to 83 through which the gas streaming from the supply means 47 into the plasma space 57 is guided. Above the wall 75 is located a wall 84 which together with the wall 75 forms the hollow metal plate. The advantage of this variant is that the tolerances of the bores in the metal plate for the pipes 39 to 45 can be smaller and that the gas streaming is improved through the openings 76 to 83. The distance between the walls 75, 84 in practice is approximately 10 to 20 mm. If required, the openings 76 to 83 can further be provided with additional nozzles so that feeding the gas into the space 57 takes place even more specifically. The gas streaming from the nozzles is swirled and only subsequently drawn off via the pipe openings 58 to 64.

The size of space 35 is determined by the process parameters. In order to achieve a homogeneous vacuum, a pressure gradient within the space from the central pump connection 37 to the electrode edges must be avoided, i.e. the conductance of this space parallel to the electrode area must be great. The distance between the upper and the lower boundary of the space 35 is typically of the order of magnitude of approximately 5 to 10 cm.

If the metal plate 46 (FIG. 3) is implemented as a hollow body (FIG. 5) a vacuum situation exists in which process pressure and process gas obtain in the discharge space 57 and in the intermediate space between metal plate 84 and electrode 28 while in the buffer space 35 a vacuum obtains. In contrast, in the hollow space behind the electrode 28 atmospheric pressure is present if no pump is connected. As a result, additional dark space shielding of the electrode body 28 in the rearward direction which is not desirable because of the losses through reactive currents connected therewith, is avoided. In this hollow space a matching network for the high-frequency feeding of the electrode can be provided.

The bellows extending from the electrode 28 via the port 36 through the grounded housing 21 are insulated so that the high frequency cannot leak outwardly. Furthermore the lateral supports 67, 68 must be insulated so that in the hollow space between the metal plate 46 and the electrode 28 no plasma ignition occurs.

We claim:

1. Arrangement for the production of a plasma as well as for applying charged or uncharged particles onto a substrate, said arrangement comprising:

a first electrode connected to a means for supplying an electrical potential;

at least a second electrode opposite to said first electrode and connected to a means for supplying an electrical potential;

a vacuum chamber enclosing said first and at least a second electrodes;

means for supplying gas through one of said electrodes into the space between said first and said at least a second electrodes;

means for making the surface area of at least one of said electrodes variable;

the ratio of the transverse cross-sectional dimensions of said first and second electrodes being constant; and means for exhausting gas through one of said electrodes from said space between said first and said at least a second electrodes.

2. Arrangement as stated in claim 1, in which one of said electrodes is stationary and has a given surface area.

3. Arrangement as stated in claim 1 in which the means for making the surface area of at least one of the electrodes variable comprises a metal plate with through-bores and which includes through said through-bores pipes which are slidable and which establish a spatial connection from the plasma region to a vacuum region and wherein said metal plate and said pipes are connected to said means for supplying an electrical potential.

4. Arrangement as stated in claim 3, in which said second electrode is at a variable distance from said first electrode, said pipes being set into said second electrode.

5. Arrangement as stated in claim 4, which includes a pump device and a bellows and in which said second electrode has a hollow space which is connected with said pump device via said bellows.

6. Arrangement as stated in claim 4, which includes lifting devices and in which said second electrode is connected with said lifting devices.

7. Arrangement as stated in claim 4, in which said means for supplying gas includes a gas inlet between said metal plate and said second electrode.

8. Arrangement as stated in claim 4, in which said pipes have external walls and which includes between said external walls of said pipes and said through-bores in said metal plate in each instance a sufficiently large gap which permits the passage of a gas from the space between said second electrode and said metal plate into the space between said metal plate and said first electrode.

9. Arrangement as stated in claim 3, in which said metal plate is stationary while said pipes are slidable.

10. Arrangement as stated in claim 3, in which said metal plate is slidable while said pipes are stationary.

11. Arrangement as stated in claim 3, in which said metal plate is a hollow plate has outlet openings for a gas.

12. Arrangement as stated in claim 1, which includes a housing and in which said first electrode and said second electrode are disposed in said housing, and which includes a gas seal, an interior space of said vacuum chamber housing being divided through said gas seal into an upper and a lower region.

* * * * *